(12) United States Patent
Guo et al.

(10) Patent No.: US 8,138,547 B2
(45) Date of Patent: Mar. 20, 2012

(54) MOSFET ON SILICON-ON-INSULATOR REDX WITH ASYMMETRIC SOURCE-DRAIN CONTACTS

(75) Inventors: Dechao Guo, Wappingers Falls, NY (US); Shu-Jen Han, Wappingers Falls, NY (US); Chung-Hsun Lin, White Plains, NY (US); Ning Su, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 12/548,005

(22) Filed: Aug. 26, 2009

(65) Prior Publication Data

US 2011/0049624 A1  Mar. 3, 2011

(51) Int. Cl.
*H01L 29/786* (2006.01)
*H01L 21/336* (2006.01)

(52) U.S. Cl. ......... 257/347; 257/E29.286; 257/E21.415; 438/302

(58) Field of Classification Search .................. 257/347, 257/E29.286, E21.415
See application file for complete search history.

(56) References Cited

U.S. PATENT DOCUMENTS

| | | | |
|---|---|---|---|
| 4,696,093 A | 9/1987 | Welch | |
| 4,728,617 A | 3/1988 | Woo et al. | |
| 5,663,584 A | 9/1997 | Welch | |
| 6,339,005 B1 | 1/2002 | Bryant et al. | |
| 6,344,675 B1 * | 2/2002 | Imai | 257/347 |
| 6,479,868 B1 * | 11/2002 | An et al. | 257/348 |
| 7,183,573 B2 | 2/2007 | Bryant et al. | |
| 7,329,937 B2 | 2/2008 | Nowak | |
| 7,492,029 B2 | 2/2009 | Nowak | |
| 2008/0308867 A1 * | 12/2008 | Cai et al. | 257/348 |

OTHER PUBLICATIONS

Kuo, Po-Yi, et al., "Suppression of the floating-body effect in poly-Si thin-film transistors with self-aligned Schottky barrier source and ohmic body contract structure," Department of Electron. Eng., Nat. Chiao-Tung Univ., Hsinchu, Taiwan, ISSN: 0741-3106, vol. 25, issue 9, pp. 634-636; Sep. 2004, Abstract only.

Ikeda, K., et al., "50-nm Schottky source/drain p-MOSFETs with a SiGe channel," Electron Device Letters, IEEE, vol. 23, issue 11, ISSN 0741-3106, pp. 670-672, Nov. 2002, Abstract only.

* cited by examiner

*Primary Examiner* — Matthew W Such
*Assistant Examiner* — Monica D Harrison
(74) *Attorney, Agent, or Firm* — Jon A. Gibbons; Fleit Gibbons Gutman Bongini & Bianco PL (57) ABSTRACT

A semiconductor device is disclosed that includes a silicon-on-insulator substrate including a buried insulator layer and an overlying semiconductor layer. Source extension and drain extension regions are formed in the semiconductor layer. A deep drain region and a deep source region are formed in the semiconductor layer. A first metal-semiconductor alloy contact layer is formed using tilted metal formation at an angle tilted towards the source extension region, such that the source extension region has a metal-semiconductor alloy contact that abuts the substrate from the source side, as a Schottky contact therebetween and the gate shields metal deposition from abutting the deep drain region. A second metal-semiconductor alloy contact is formed located on the first metal-semiconductor layer on each of the source extension region and drain extension region.

12 Claims, 8 Drawing Sheets

MOSFET ON SILICON-ON-INSULATOR REDX WITH ASYMMETRIC SOURCE-DRAIN CONTACTS

FIELD OF THE INVENTION

The present invention generally relates to the field of semiconductors, and more particularly relates to metal oxide semiconductor field effect transistors ("MOSFETs") with asymmetric source-drain contacts.

BACKGROUND OF THE INVENTION

Figure 1:
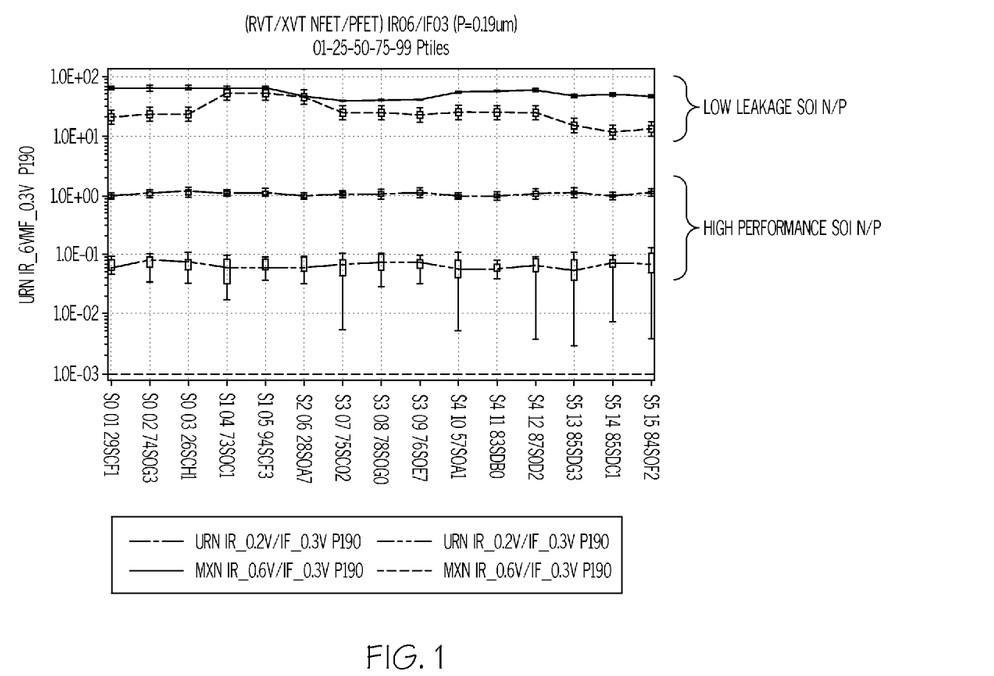
FIG. 1, already described above, is a chart of the IR/IF ratio for low leakage SOI MOSFET device as compared to high performance SOI MOSFET device.

A conventional MOSFET produced on a silicon-on-insulator ("SOI") substrate (hereinafter "SOI MOSFET" device) used for slower performance applications many times can tolerate the floating body (FB) effect. However, SOI MOSFETs that are to be used for high performance applications generally cannot. SOI MOSFET performance suffers from the floating body effect, especially at higher speeds. In addition, many times SOI MOSFETs need to be modeled very accurately. The floating body effect is difficult to model because it is not a steady-state effect. Further, in applications for SOI MOSFET devices where low leakage current is required generally suffers more from the floating body effect. This is because low leakage current applications often requires increases in substrate doping which increases the reverse biased junction leakage and thus the floating body effect. For example, low leakage SOI MOSFET device exhibits much higher IR/IF ratio (where "IR" denotes reverse junction leakage and "IF" denotes forward junction leakage) than high performance SOI MOSFET devices. FIG. 1 is a chart of IR/IF ratios for low leakage SOI MOSFET devices as compared with high performance SOI MOSFET devices. Specifically, the IR/IF ratio of low leakage SOI MOSFET devices has a couple orders of magnitude higher IR/IF ratio as compared with high performance SOI MOSFET devices. This high IR/IF ratio for low leakage SOI MOSFET device typically causes more severe floating body effects.

SUMMARY OF THE INVENTION

A semiconductor device and process for forming the device is disclosed. The semiconductor device includes a silicon-on-insulator substrate including a buried insulator layer and an overlying semiconductor layer. Source extension and drain extension regions are formed in the semiconductor layer. A deep drain region and a deep source region are formed in the semiconductor layer. A first metal-semiconductor alloy contact layer is formed using tilted metal formation at an angle tilted towards the source extension region, such that the source extension region has a metal-semiconductor alloy contact that abuts the substrate from the source side as a Schottky contact therebetween, and the gate shields metal formation from abutting the deep drain region. A second metal-semiconductor alloy contact is formed located on the first metal-semiconductor layer on each of the source extension region and drain extension region.

In one embodiment, the second metal-semiconductor alloy contact does not abut the gate, from either the source extension region or the drain extension region. The first metal-semiconductor alloy contact layer using tilted metal formation is formed with titled deposition. In another embodiment, the first metal-semiconductor alloy contact layer is formed with titled implantation. Optionally, the first metal-semiconductor alloy contact layer after titled formation is annealed.

In one embodiment, with a sacrificial spacer the first metal-semiconductor alloy contact layer using tilted metal formation is formed is at the angle θ titled towards the source extension region such that a size of the angle θ is:

$$7° < \theta < \arctan\left(\frac{L - 2 \times L_1 - L_g}{h}\right)$$

where L is a length between gates, $L_1$ is a width of a first spacer surrounding each side of the gates, $L_g$ is a length of the gates; and h is a height of the gates.

In another embodiment, without sacrificial spacer, the first metal-semiconductor alloy contact layer using tilted metal formation is formed is at the angle θ titled towards the source extension region such that a size of the angle θ is:

$$7° < \theta < \arctan\left(\frac{L - 2 \times L_1 - 2 \times L_2 - L_g}{h}\right)$$

where L is a length between gates, $L_1$ is a width of a first spacer surrounding each side of the gates, $L_2$ is a width of a second spacer surrounding each side of the gates, $L_g$ is a length of the gates; and h is a height of the gates.

BRIEF DESCRIPTION OF THE DRAWINGS

The foregoing and other features and advantages of the subject matter disclosed herein will be made apparent from the following detailed description taken in conjunction with the accompanying drawings, in which.

DETAILED DESCRIPTION

Preferred embodiments of the present invention will be described in detail hereinbelow with reference to the attached drawings.

Prior art methods including source-side only preamorphization implant (PAI) and/or halo are used to reduce the floating body effect to the success of SOI technology. However, these current methods increase forward biased junction leakage and reduce IR/IF ratio and floating body (FB) effect. In contrast, the inventors discovered that the creation of an asymmetric source-drain contact with a Shottky contact formed that abuts the substrate from the source side reduces the floating body effect.

Further the inventors discovered that utilizing a novel device structure with process flow to form Schottky contact between source and body increase forward-biased junction leakage and eliminates the floating body effect. Moreover, in one embodiment, a direct contact between drain side contact is prevented to limit reverse junction leakage that will dominates the SOI MOSFET devices current in off state $I_{off}$.

Figure 2:
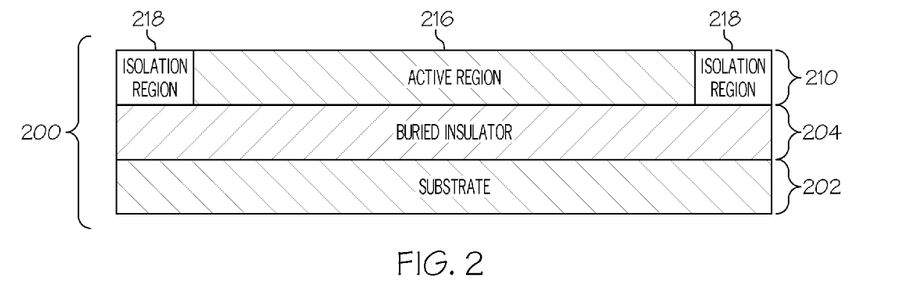
FIGS. 2-4 illustrates fabrication of a SOI MOSFET device.
Figure 3:
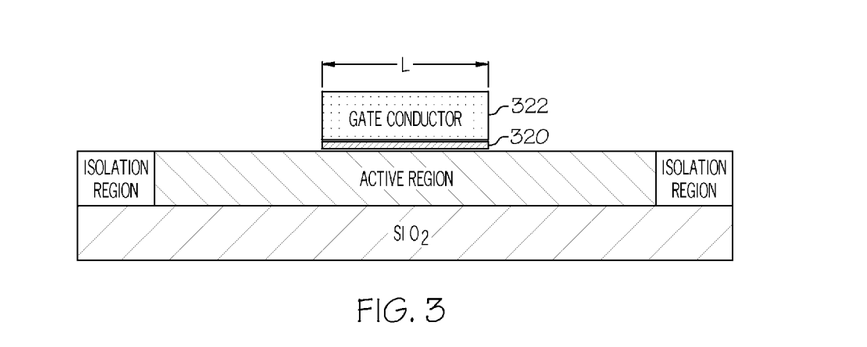
Figure 4:
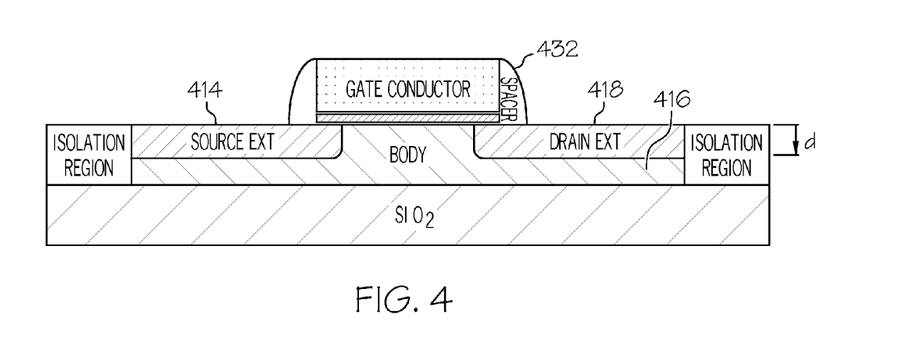

FIGS. 2-4 illustrates fabrication of a MOSFET on SOI substrate according to one embodiment of the present invention;

As shown in FIG. 2, an SOI substrate 200 is provided. The SOI substrate 200 is formed by a handle substrate 202 (e.g., a silicon substrate), an overlying buried insulator layer 204 (e.g., an oxide layer), and an overlying semiconductor layer 210. Shallow trench isolation regions 218 of a dielectric material are formed in the semiconductor layer 210. The shallow trench isolation region 218 abuts the buried insulator layer 204 and laterally surrounds an active region 216 in the semiconductor layer 210, so as to electrically isolate the active region 216 from other portions of the semiconductor layer 210 (e.g., other active regions).

In exemplary embodiments, the active region 216 comprises a single crystalline semiconductor material, such as silicon, germanium, a silicon-germanium alloy, a silicon-carbon alloy, a silicon-germanium-carbon alloy, gallium arsenide, indium arsenide, indium phosphide, a III-V compound semiconductor material, a II-VI compound semiconductor material, or an organic semiconductor material. In this exemplary embodiment, the semiconductor material comprises silicon. The active region 216 of this embodiment is doped with a dopant of a first conductivity type, such as a p-type dopant (e.g., boron, gallium, or indium) or an n-type dopant (e.g., phosphorus, arsenic, or antimony). The concentration of the dopant is from about $1.0 \times 10^{15}$ atoms/cm$^3$ to about $1.0 \times 10^{19}$ atoms/cm$^3$. Non-electrical stress-generating dopants, such as germanium and carbon may also be present. The active region 216 may also have a built-in biaxial stress in the plane of the active region 216 (i.e., in the plane perpendicular to the direction of the top surface 19 of the active region 216.

As shown in FIG. 3, a gate dielectric 320 and a gate conductor 322 are formed on the active region 216. More specifically, a stack of a gate dielectric layer and a gate conductor layer are formed on the active region 216. This stack is then lithographically patterned and etched to form the gate dielectric 320 and the overlying gate conductor 322 in a portion of the active region 216 of the semiconductor layer 210.

The gate dielectric 320 of this embodiment comprises a conventional dielectric material (such as silicon oxide, silicon nitride, silicon oxynitride, or a stack thereof) that is formed by thermal conversion of a top portion of the active region 216 and/or by chemical vapor deposition ("CVD"). In alternative embodiments, the gate dielectric 320 comprises a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed in a known manner (such as by CVD, atomic layer deposition ("ALD"), molecular beam epitaxy ("MBE"), pulsed laser deposition ("PLD"), liquid source misted chemical deposition ("LSMCD"), or physical vapor deposition ("PVD")). The thickness of the gate dielectric layer is from about 1 nm to about 3 nm in exemplary embodiment having a conventional dielectric material, and from about 2 nm to about 6 nm in exemplary embodiment having a high-k dielectric material, and may have an effective oxide thickness on the order of or less than 1 nm.

The gate conductor 322 comprises a semiconductor (e.g., polysilicon) gate layer and/or a metal gate layer. In one embodiment in which of the gate dielectric 320 comprises a conventional dielectric material, the gate conductor 322 is a semiconductor gate layer and has a thickness from about 40 nm to about 200 nm. In one embodiment in which the gate dielectric comprises a high-k dielectric material, the gate conductor 322 is a metal gate layer abutting the gate dielectric 320 and comprising a conductive refractory metal nitride (such as TaN, TiN, WN, TiAlN, TaCN, or an alloy thereof). The thickness of the metal gate layer in this embodiment is from about 2 nm to about 200 nm, and preferably from about 7 nm to about 320 nm. In another embodiment, the gate conductor 322 comprises a stack of a metal gate layer and a semiconductor gate layer.

The length L of the gate conductor 322 of this embodiment is determined by lithographic means, and is a lithographic minimum length (or a "critical dimension"). In some embodiments, a trimming etch is employed to reduce the length L of the gate conductor 322 to a length that is less than the lithographic minimum length.

As shown in FIG. 4, a first gate spacer layer 432 comprising a dielectric material (such as silicon oxide) is then formed on the gate conductor 322 and on the semiconductor layer 210. Alternatively, a reactive-ion etch process can be used to remove the dielectric material on top of the gate and on the semiconductor layer so as to form a gate spacer only on the sidewall of the gate conductor 322. Ion implantations are performed into the semiconductor layer 210 employing the gate conductor 322 as an implantation mask in order to form a source extension region 414 and a drain extension region 418 that are self-aligned to the gate conductor 322. The source extension region 414 and the drain extension region 418 are formed in the semiconductor layer 210 at the same time. This ion implantation to form the extension regions can be performed before or after the formation of the first gate spacer layer 432, or alternatively formation of the first gate spacer layer 432 can be omitted. If the ion implantation follows formation of the first gate spacer layer 432, the vertical portions of the first gate spacer layer 432 on the sidewalls of the gate conductor 322 also serve as an implantation mask. In complementary MOSFET (CMOS) technologies which have both n-type MOSFETs and p-type MOSFETs, block masks are used to define where extension implants occur. In particular, one mask is used to open n-type MOSFET regions and block p-type MOSFET regions for ion implantation of n-type dopants in order to form source and drain extension regions in the n type MOSFETs. Another mask, complementary to the first mask, is used to open the p-type MOSFET regions and block n-type MOSFET regions for ion implantation of p-type dopants in order to form source and drain extension regions in the p-type-MOSFETs.

The portion of the active region that is not implanted with dopant ions during the ion implantation constitutes the body 416 of the MOSFET and has first conductivity type doping. The source extension region 414 and the drain extension region 418 has a first depth d (e.g., from about 5 nm to about 320 nm), and outer edges of these extension regions extend under the gate dielectric 320. Thus, the source extension region 414 and the drain extension region 418 both abut the gate dielectric 320 and have a second conductivity type doping, which is the opposite the first conductivity type doping. The source extension region 414 and the drain extension region 418 of this exemplary embodiment have a doping concentration from about $1.0 \times 10^{19}$ atoms/cm$^3$ to about $1.0 \times 10^{21}$ atoms/cm$^3$. In some embodiments, another ion implantation done at a tilted angle is then performed to form halo regions under the source and drain extension regions.

Embodiment with Sacrificial Spacer

Figure 5:
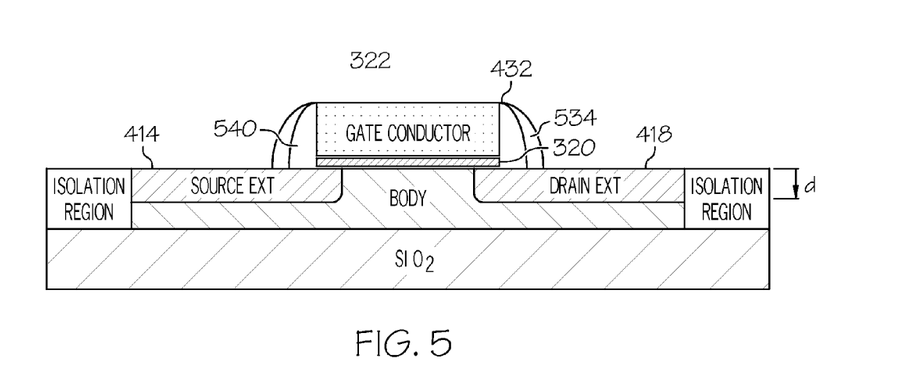
FIGS. 5-8 illustrate fabrication of a SOI MOSFET device of FIG. 4, with asymmetric source-drain contacts with a sacrificial spacer.

FIGS. 5-8 illustrate fabrication of a SOI MOSFET device of FIG. 4, with asymmetric source-drain contacts with a sacrificial spacer. As shown in FIG. 5, a second gate spacer layer is deposited on the first gate spacer layer 432, and then these two layers are etched (e.g., using reactive ion etching) to form a gate spacer 540. This gate spacer 540 comprises the combination of the first gate spacer layer portion 432 and the second gate spacer layer portion 534. In exemplary embodiments, the second gate spacer layer portion 534 comprises a dielectric material that is the same as or different than the dielectric material of the first gate spacer layer portion 432. For example, in this embodiment the first gate spacer layer portion 432 comprises silicon oxide and the second gate spacer layer portion 534 comprises silicon nitride. The dielectric materials for the first and second gate spacer layer portions may include low-k dielectric materials. The portion of the first gate spacer layer 432 outside the outer sidewalls of the second gate spacer layer portion 534 is removed during the reactive ion etching.

Thus, the gate spacer 540 laterally abuts the sidewalls of the gate conductor 322 and the gate dielectric 320, and abuts the source extension region 414 and the drain extension region 418. In this embodiment, the thickness of the gate spacer 540, as measured laterally at the base of the gate spacer 540 from the sidewall of the gate conductor 322 abutting the spacer 540 to an outer edge of the gate spacer 540 adjoining either the source extension region 414 or the drain extension region 418, is from about 202 nm to about 2020 nm, and preferably from about 218 nm to about 2000 nm. In alternative embodiments, the gate spacer 540 is formed by only one or more than two gate spacer layers.

Next, deep source-drain implants are performed using conventional methods. More specifically, a mask is first formed to define where the deep source-drain implants will occur. These masks include a first mask for defining the deep source-drain implants of a p-type MOSFET and a second mask defining the deep source-drain implants of an n-type MOSFET. In practice, designs typically include multiple incidences of NFETs and PFETs, and can have any layout style.

Figure 6:
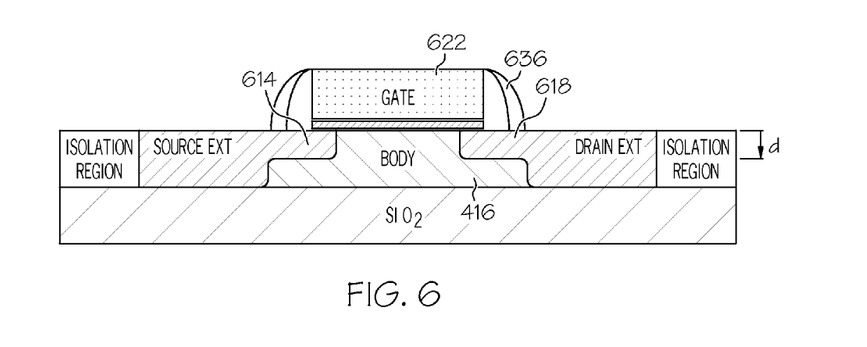

As shown in FIG. 6, the deep-source drain implants form a deep source region 614 and a deep drain region 618. An optional sacrificial spacer 636. Next, in FIG. 7, a source contact 754 and a drain contact 758 are formed by metallization of exposed semiconductor material. In one embodiment, titled metal formation 750 at an angle θ from vertical titled toward the SOI substrate 200 of the device as shown. In one embodiment, the angle θ is selected to ensure that the drain side contact does not contact the body 416 as shown. The gate 622 acts to shield portions of the drain extension 418 from metal deposition as shown by shadow line 760. Therefore, no special lithography process is required. It is important to note that the present invention is not limited to forming a metal-semiconductor alloy contact using titled metal deposition. In another embodiment, the gate 622 acts to shield portion of the drain extension from metal implanting, such as nickel platinum implanting followed by conventional annealing. A Schottky contact 770 is formed between source contact 754 and body 416. It was discovered that this Schottky contact 770 formed between source contact 754 and body 416 largely increases forward-biased junction leakage and eliminate the floating body effect.

Titled Angle in Embodiment with Sacrificial Spacer

Figure 7:
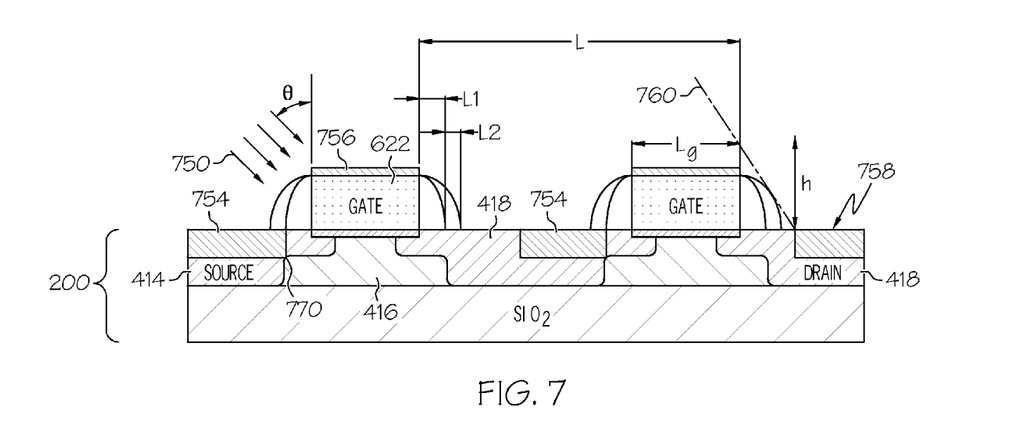

As shown in FIG. 7, the angle θ from vertical titled toward the SOI substrate 200 of the device as shown $$7° < \theta < \arctan\left(\frac{L - 2 \times L_1 - 2 \times L_2 - L_g}{h}\right)$$

where as shown in FIG. 7, L is the length between gates;

$L_1$ is the width of the first spacer surrounding the sides of the gate;

$L_2$ is the width of the second spacer surrounding the first spacer;

$L_g$ is the length of the gate; and h is the height of the gate.

For example, in current technology, h=60 nm, L=130 nm, L1~15 nm, L2~15 nm, Lg=35 nm, 7°<θ<30°. It is important to note that as technology advances the geometries shown will allow for ranges of the angle θ greater than 30°.

Figure 8:
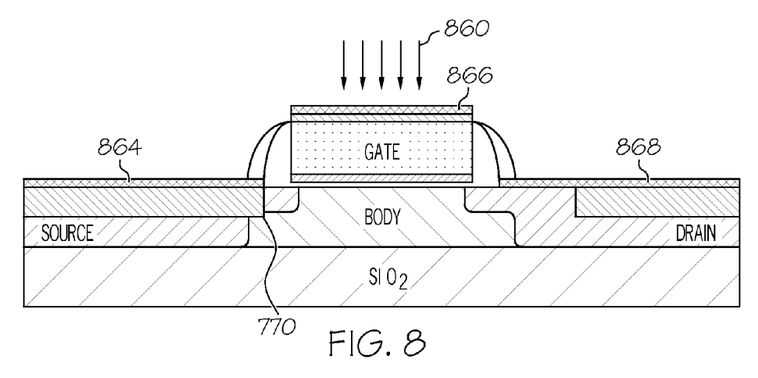

Reviewing FIG. 8, a second metal-semiconductor alloy contact is formed 860 on over the previously formed layers in FIG. 7 for the source regions 864, gate 866 and drain regions 868 as shown. Again, as with the first metal-semiconductor alloy contact formed in FIG. 7, this second metal-semiconductor alloy contact can be formed using deposition such as blanket deposition or implantation. Each of the first and second metal layers comprise a metal capable of forming a metal-semiconductor alloy with the semiconductor material of the semiconductor layer 210 (such as tungsten, tantalum, titanium, cobalt, nickel, platinum, osmium, or an alloy thereof). A preferred thickness of each of the metal layers ranges from about 5 nm to about 320 nm, and more preferably from about 202 nm to about 25 nm. In some embodiments, a metal nitride capping layer (e.g., containing a refractory metal nitride such as TaN, TiN TaSiN, and/or HfN,) is deposited over the metal layer.

An annealing step is then performed so that the metal layer reacts with the semiconductor material of the semiconductor layer 210 to form the source contact 864 and the drain contact 868

Embodiment Without Sacrificial Spacer

Figure 9:
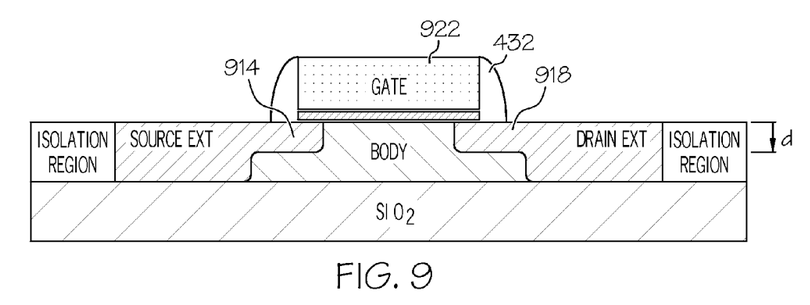
FIGS. 9-11 illustrate fabrication of a SOI MOSFET device of FIG. 5, with asymmetric source-drain contacts without a sacrificial spacer.
Figure 10:
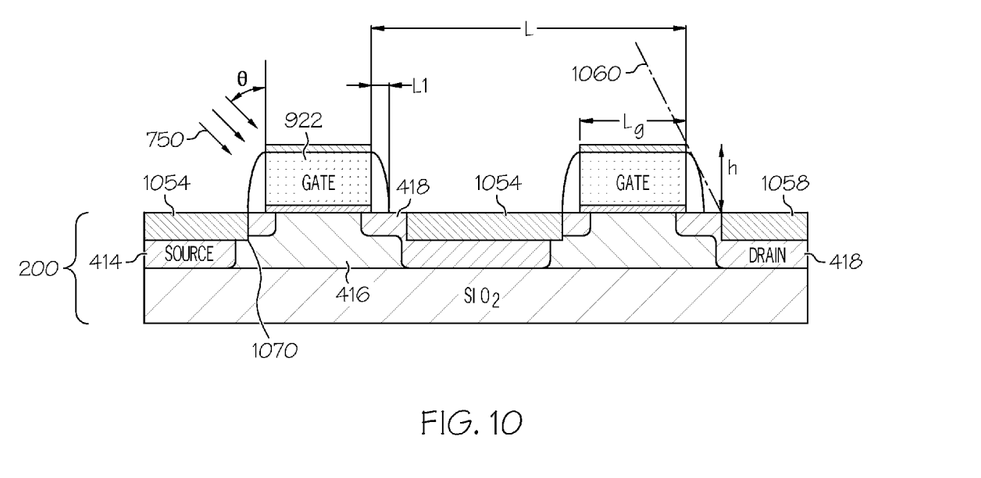
Figure 11:
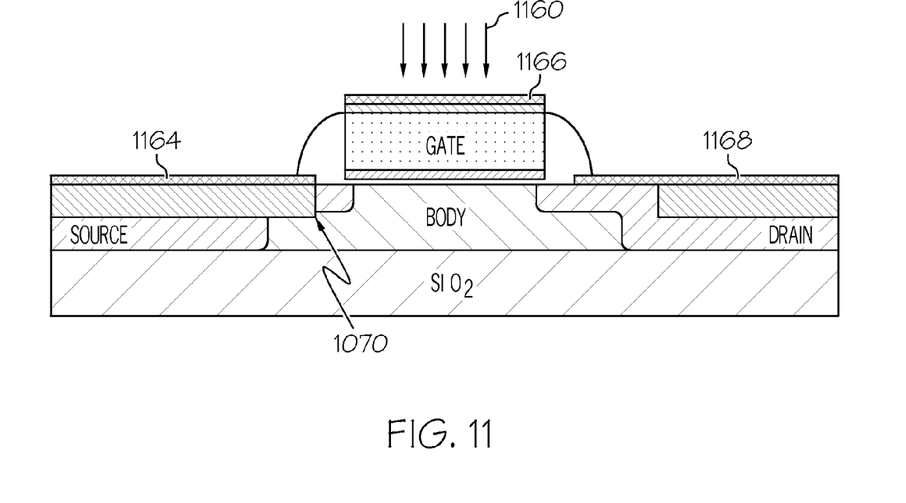

FIGS. 9-11 illustrate fabrication of a SOI MOSFET device of FIG. 5, with asymmetric source-drain contacts without a sacrificial spacer. The fabrication is identical to the process described for FIGS. 5-8 above. However, there is no second or sacrificial spacer 636 as shown in FIG. 6. This changes the geometry when tilted angle metal formation is preformed. In FIG. 9 the outer sacrificial spacer 534 is removed using RIE (Reactive-Ion Etching) process, wet edges process or other techniques know to those skilled in the art to remove one edge without affecting the first spacer 432 around gate 922.

Titled Angle in Embodiment Without Sacrificial Spacer

Next, in FIG. 10, a source contact 1054 and a drain contact 1054 are formed by metallization of exposed semiconductor material. In one embodiment, titled metal formation 950 at an angle θ from vertical titled toward the SOI substrate 200 of the device as shown. In one embodiment, the angle θ is selected to ensure that the drain side contact does not contact the body 416 as shown. The gate 922 acts to shield portions of the drain extension 418 from metal deposition as shown by shadow line 1060. Therefore, no special lithography process is required. It is important to note that the present invention is not limited to forming a metal-semiconductor alloy contact using titled metal deposition. In another embodiment, the gate 922 acts to shield portion of the drain extension from metal implanting, such as nickel platinum implanting followed by conventional annealing. A Schottky contact 1070 is formed between source contact 1054 and body 416. It was discovered that this Schottky contact 1070 formed between source contact 1054 and body 416 largely increases forward-biased junction leakage and eliminate the floating body effect.

As shown in FIG. 10, the angle θ from vertical titled toward the SOI substrate 200 of the device as shown $$7° < \theta < \arctan\left(\frac{L - 2 \times L_1 - L_g}{h}\right)$$

where as shown in FIG. 10, L is the length between gates;

$L_1$ is the width of the first spacer surrounding the sides of the gate;

$L_g$ is the length of the gate;

h is the height of the gate

For example, in current technology, h=60 nm, L=130 nm, L1~15 nm, Lg=35 nm, 7°<θ<47°.

FIG. 11, a second metal-semiconductor alloy contact is formed on over the previously formed layers in FIG. 10 for the source regions 964 as previously described in above for FIG. 8 in which a second metal-semiconductor alloy contact is formed 1160 on over the previously formed layers in FIG. 7 for the source regions 1164, gate 1166 and drain regions 1168 as shown.

Example Process Flow

Figure 12:
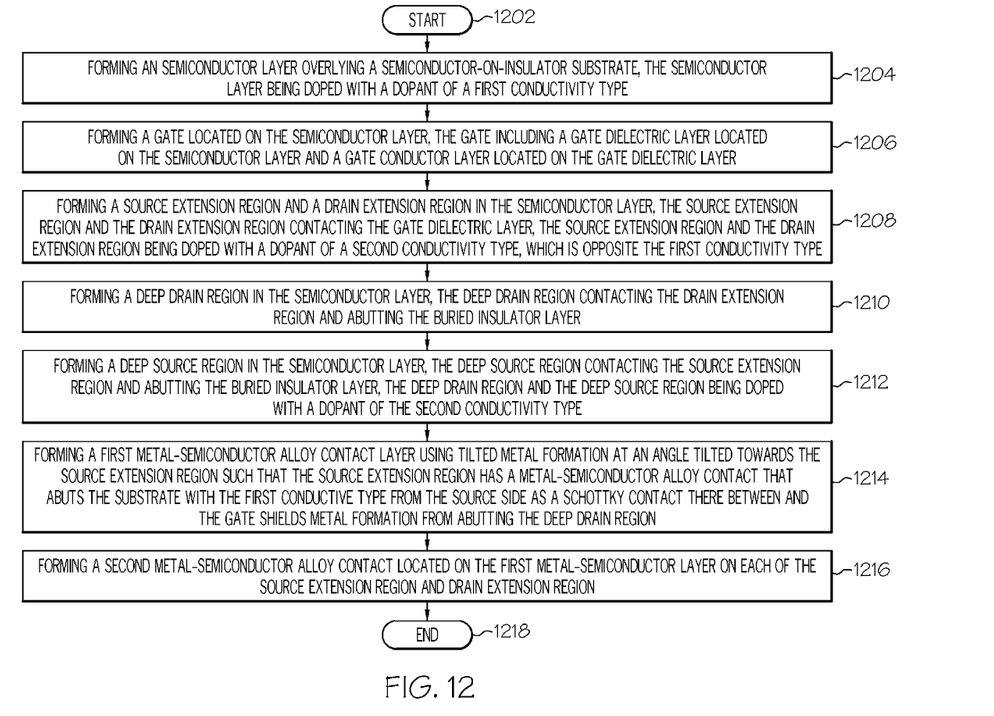
FIG. 12 is a flow chart illustrating a method of fabricating the SOI MOSFET device of FIGS. 2-11.

Referring now to FIG. 12, shown is a flow chart illustrating a method of fabricating the MOSFET on SOI substrate of FIGS. 2-11. The process begins in step 1202 and immediately proceeds to step 1204 by forming a semiconductor layer overlying a silicon-on-insulator substrate including a buried insulator layer. The semiconductor layer is doped with a dopant of a first conductivity type. Next in step 1206, a gate located on the semiconductor layer is formed. The gate includes a gate dielectric layer located on the semiconductor layer and a gate conductor layer located on the gate dielectric layer. Continuing to step 1208, a source extension region and a drain extension region in the semiconductor layer are formed. The source extension region and the drain extension region contacting the gate dielectric layer, the source extension region and the drain extension region being doped with a dopant of a second conductivity type, which is opposite the first conductivity type. In step 1210, a deep drain region is formed in the semiconductor layer. The deep drain region contacts the drain extension region and abuts the buried insulator layer. In step 1212, a deep source region is formed in the semiconductor layer. The deep source region contacts the source extension region and abutting the buried insulator layer, the deep drain region and the deep source region being doped with a dopant of the second conductivity type. Optionally, as shown in FIGS. 5-8, a sacrificial spacer is used to prior to formation of the first metal-semiconductor alloy contact layer and subsequently removed (not shown) after the formation of the first metal-semiconductor alloy contact layer. Next in step 1214, a first metal-semiconductor alloy contact layer is formed using tilted metal formation at an angle tilted towards the source extension region such that the source extension region has a metal-semiconductor alloy contact that abuts the substrate with the first conductive type from the source side as a Schottky contact therebetween and the gate shields metal formation from abutting the deep drain region. Continuing in step 1216, a second metal-semiconductor alloy contact is formed located on the first metal-semiconductor layer on each of the source extension region and drain extension region and the process ends in step 1218.

NON-LIMITING EXAMPLES

It should be noted that some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for fabricating a semiconductor device, the method comprising:

providing a silicon-on-insulator (SOI) substrate including a buried insulator layer;

forming a semiconductor layer overlying the SOI substrate, the semiconductor layer being doped with a dopant of a first conductivity type;

forming a gate located on the semiconductor layer, the gate including a gate dielectric layer located on the semiconductor layer and a gate conductor layer located on the gate dielectric layer;

forming a source extension region and a drain extension region in the semiconductor layer, the source extension region and the drain extension region contacting the gate dielectric layer, the source extension region and the drain extension region being doped with a dopant of a second conductivity type, which is opposite the first conductivity type;

forming a deep drain region in the semiconductor layer, the deep drain region contacting the drain extension region and abutting the buried insulator layer;

forming a deep source region in the semiconductor layer, the deep source region contacting the source extension region and abutting the buried insulator layer, the deep drain region and the deep source region being doped with a dopant of the second conductivity type;

forming a first metal-semiconductor alloy contact layer using tilted metal formation at an angle tilted towards the source extension region such that the source extension region has a metal-semiconductor alloy contact that abuts the substrate with the first conductive type from the source extension region as a Schottky contact therebetween and the gate shields metal deposition from abutting the deep drain region, wherein the forming the first metal-semiconductor alloy contact layer using tilted metal formation is formed is at the angle θ tilted towards the source extension region such that a size of the angle θ is:

$$7° < \theta < \arctan\left(\frac{L - 2 \times L_1 - L_g}{h}\right)$$

where L is a length between gates, $L_1$ is a width of a first spacer surrounding each side of the gates, $L_g$ is a length of the gates; and h is a height of the gates; and forming a second metal-semiconductor alloy contact located on the first metal-semiconductor layer on each of the source extension region and drain extension region.

2. The method for fabricating the semiconductor device of claim 1, wherein the second metal-semiconductor alloy contact does not abut the gate, from either the source extension region or the drain extension region.

3. The method for fabricating the semiconductor device of claim 1, wherein the forming the first metal-semiconductor alloy contact layer using tilted metal formation is formed with titled deposition.

4. The method for fabricating the semiconductor device of claim 1, wherein the forming the first metal-semiconductor alloy contact layer using tilted metal formation is formed with titled implantation.

5. The method for fabricating the semiconductor device of claim 4, further comprising:
annealing the first metal-semiconductor alloy contact layer after titled implantation.

6. A method for fabricating a semiconductor device, the method comprising:
providing a silicon-on-insulator (SOI) substrate including a buried insulator layer;
forming a semiconductor layer overlying the SOI substrate, the semiconductor layer being doped with a dopant of a first conductivity type;
forming a gate located on the semiconductor layer, the gate including a gate dielectric layer located on the semiconductor layer and a gate conductor layer located on the gate dielectric layer;
forming a source extension region and a drain extension region in the semiconductor layer, the source extension region and the drain extension region contacting the gate dielectric layer, the source extension region and the drain extension region being doped with a dopant of a second conductivity type, which is opposite the first conductivity type;
forming a deep drain region in the semiconductor layer, the deep drain region contacting the drain extension region and abutting the buried insulator layer;
forming a deep source region in the semiconductor layer, the deep source region contacting the source extension region and abutting the buried insulator layer, the deep drain region and the deep source region being doped with a dopant of the second conductivity type;

forming a first metal-semiconductor alloy contact layer using tilted metal formation at an angle tilted towards the source extension region such that the source extension region has a metal-semiconductor alloy contact that abuts the substrate with the first conductive type from the source extension region as a Schottky contact therebetween and the gate shields metal deposition from abutting the deep drain region, wherein the forming the first metal-semiconductor alloy contact layer using tilted metal formation is formed is at the angle θ tilted towards the source extension region such that a size of the angle θ is:

$$7° < \theta < \arctan\left(\frac{L - 2 \times L_1 - 2 \times L_2 - L_g}{h}\right)$$

where L is a length between gates, $L_1$ is a width of a first spacer surrounding each side of the gates, $L_1$ is a width of a second spacer surrounding each side of the gates, $L_g$ is a length of the gates; and h is a height of the gates; and forming a second metal-semiconductor alloy contact located on the first metal-semiconductor layer on each of the source extension region and drain extension region.

7. A silicon-on-insulator (SOI) transistor, comprising:
a substrate including a buried insulator layer with a semiconductor layer formed thereon;
a gate formed on the semiconductor layer with a gate dielectric layer located on the semiconductor layer and a gate conductor layer located on the gate dielectric layer;
a source extension region and a drain extension region formed in the semiconductor layer, the source extension region and the drain extension region contacting the gate dielectric layer;
a deep drain region formed in the semiconductor layer, the deep drain region contacting the drain extension region and abutting the buried insulator layer;
a deep source region in the semiconductor layer, the deep source region contacting the source extension region and abutting the buried insulator layer, the deep drain region;
a first metal-semiconductor alloy contact layer formed using tilted metal formation at an angle tilted towards the source extension region such that the source extension region has a metal-semiconductor alloy contact that abuts the substrate with the first conductive type from the source extension region as a Schottky contact therebetween and the gate shields metal deposition from abutting the deep drain region, wherein the forming the first metal-semiconductor alloy contact layer using tilted metal formation is formed is at the angle θ titled towards the source extension region such that a size of the angle θ is:

$$7° < \theta < \arctan\left(\frac{L - 2 \times L_1 - L_g}{h}\right)$$

where L is a length between gates, L1 is a width of a first spacer surrounding each side of the gates, $L_g$ is a length of the gates; and h is a height of the gates; and a second metal-semiconductor alloy contact located on the first metal-semiconductor layer on each of the source extension region and drain extension region.

8. The SOI transistor according to claim 7, wherein the second metal-semiconductor alloy contact does not abut the gate, from either the source extension region or the drain extension region.

9. The SOI transistor according to claim 7, wherein the forming the first metal-semiconductor alloy contact layer using tilted metal formation is formed with titled deposition.

10. The SOI transistor according to claim 7, wherein the forming the first metal-semiconductor alloy contact layer using tilted metal formation is formed with titled implantation.

11. The SOI transistor according to claim 10, wherein the first metal-semiconductor alloy contact layer after tilted implantation is annealed.

12. A silicon-on-insulator (SOI) transistor, comprising:
a substrate including a buried insulator layer with a semiconductor layer formed thereon;
a gate formed on the semiconductor layer with a gate dielectric layer located on the semiconductor layer and a gate conductor layer located on the gate dielectric layer;
a source extension region and a drain extension region formed in the semiconductor layer, the source extension region and the drain extension region contacting the gate dielectric layer;
a deep drain region formed in the semiconductor layer, the deep drain region contacting the drain extension region and abutting the buried insulator layer;
a deep source region in the semiconductor layer, the deep source region contacting the source extension region and abutting the buried insulator layer, the deep drain region;
a first metal-semiconductor alloy contact layer formed using tilted metal formation at an angle tilted towards the source extension region such that the source extension region has a metal-semiconductor alloy contact that abuts the substrate with the first conductive type from the source extension region as a Schottky contact therebetween and the gate shields metal deposition from abutting the deep drain region, wherein the forming the first metal-semiconductor alloy contact layer using tilted metal formation is formed is at the angle θ tilted towards the source extension region such that a size of the angle θ is:

$$7° < \theta < \arctan\left(\frac{L - 2 \times L_1 - 2 \times L_2 - L_g}{h}\right)$$

where L is a length between gates, $L_1$ is a width of a first spacer surrounding each side of the gates, $L_1$ is a width of a second spacer surrounding each side of the gates, $L_g$ is a length of the gates; and h is a height of the gates; and
a second metal-semiconductor alloy contact located on the first metal-semiconductor layer on each of the source extension region and drain extension region.

* * * * *